United States Patent [19]

Steele et al.

[11] Patent Number: 5,159,599
[45] Date of Patent: Oct. 27, 1992

[54] HIGH SPEED TESTING FOR PROGRAMMABLE LOGIC DEVICES

[75] Inventors: Randy C. Steele, Folsom, Calif.; Bruce A. Doyle, Flower Mound, Tex.

[73] Assignee: SGS-Thomson Microelectronics, Inc., Carrollton, Tex.

[21] Appl. No.: 560,383

[22] Filed: Jul. 31, 1990

[51] Int. Cl.5 ............................................. G01R 31/28
[52] U.S. Cl. .................................. 371/22.2; 371/21.3
[58] Field of Search .................. 371/22.2, 21.2, 21.3; 324/158 R; 307/465

[56] References Cited

U.S. PATENT DOCUMENTS

| | | | |
|---|---|---|---|
| 4,766,569 | 8/1988 | Turner et al. | 371/22.2 |
| 4,841,525 | 6/1989 | Liesko et al. | 371/21.3 |
| 4,872,168 | 10/1989 | Aadsen et al. | 371/21.3 |
| 4,958,345 | 9/1990 | Fujisaki | 371/21.3 |
| 5,060,230 | 10/1991 | Arimoto et al. | 371/21.2 |

*Primary Examiner*—Charles E. Atkinson
*Attorney, Agent, or Firm*—Kenneth C. Hill; Lisa K. Jorgenson; Richard K. Robinson

[57] ABSTRACT

A shift register used to shift programming and test data into a programmable logic device is modified so that each bit thereof can be directly set or reset. Control signals can be used to directly place the required test patterns into the shift register. A memory connected to the shift register, and associated logic, provides a means for testing whether data was accurately written to the array without shifting any data off of the device.

5 Claims, 1 Drawing Sheet

HIGH SPEED TESTING FOR PROGRAMMABLE LOGIC DEVICES

BACKGROUND OF THE INVENTION

1. Field of the Invention:

The present invention relates generally to semiconductor integrated circuits, and more specifically to test circuitry for use on programmable logic devices.

2. Description of the Prior Art:

Programmable logic devices are increasingly being used in the electronics industry. These devices can be easily programmed by a purchaser to perform many different simple to moderately complex logic functions for inclusion in electronic systems. Programmable logic devices may be one time programmable, or may be reprogrammable by the user.

One type of programmable logic device utilizes a programmable AND/OR array to perform logic functions. Inputs and their complements are provided as row inputs to the array, and product terms are generated as outputs therefrom. The array is typically provided as a matrix, and connections are made between the various input rows and product term lines in order to define logic functions. The provision of input signals to the array and handling of the product term outputs are well known in the art.

A typical programmable logic device of the type described above can have, for example, 22 inputs, resulting in 44 rows provided to the array. Such a typical device can also have, for example, 132 product terms. As known in the art, a bit map describing the programming of each cross-point in the array, referred to as a JEDEC bit map, is typically generated to provide data for programming the device. The data from the bit map is shifted into the programmable logic device one row at a time in order to program the rows. A serial shift register is provided on the device for such purpose.

During testing of a reprogrammable programmable logic device, it is desirable for the manufacturer to write several test patterns into the device to insure that all of the memory elements in the array are functioning properly. These patterns typically include all ones, all zeros, alternating stripes of ones and zeros, and alternating ones and zeros in a checkerboad pattern. True and inverted checkerboard and striped patterns are typically generated, giving six basic test patterns used to test the device. In order to speed up the writing of these regular test patterns, it is known in the art to simultaneously select alternate rows within the array, typically referred to as odd or even rows, and write the same data into each of these selected rows at the same time.

Many different integrated circuit technologies are used to provide the memory elements in the array for such programmable logic devices. Various types of EPROM and EEPROM cells are in common use. SRAM devices are becoming popular due to their speed and ease of programming. With the exception of SRAM based devices, programming these devices takes a relatively long time, on the order of hundreds of milliseconds. Using technologies other than SRAM, the time taken to serially shift the programming bit map into and out of the device, typically hundreds of microseconds, is an insignificant part of the programming time. However, the programming time for SRAM based devices is typically a few hundred nanoseconds, and the hundreds of microseconds required to shift data onto and off of the device dominates the programming time.

It would be desirable to provide a programmable logic device, such as a device using an SRAM technology for storing the program data, which minimizes the programming time required for the chip. It would be desirable for such a technique to provide an overall programming time which is approximately the same as the time required to program the test data into the device, and eliminating the time required to shift the programming data onto and off of the device.

SUMMARY OF THE INVENTION

It is therefore an object of the present invention to provide a programmable logic device having improved testing features.

It is another object of the present invention to provide such a programmable logic device having a decreased time for testing of the array using typical basic test patterns.

It is a further object to provide such a device which provides on chip circuitry to generate test patterns, eliminating the requirement for shifting test data onto the device for testing.

Therefore, according to the present invention, a shift register used to shift programming and test data into a programmable logic device is modified so that each bit thereof can be directly set or reset. Control signals can be used to directly place the required test patterns into the shift register. A memory connected to the shift register, and associated logic, provides a means for testing whether data was accurately written to the array without shifting any data off of the device.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
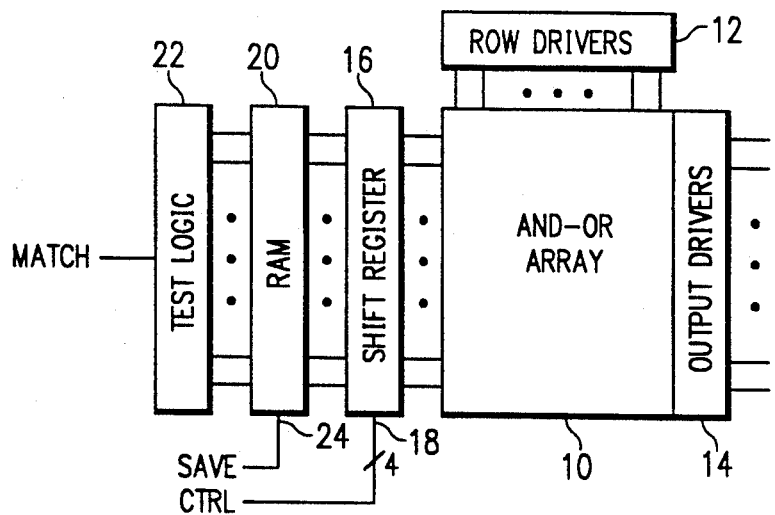
FIG. 1 is a block diagram of a portion of a programmable logic device according to the present invention.

Referring to FIG. 1, AND/OR array 10 is provided as a portion of a programmable logic device as known in the art. The AND/OR array preferably uses SRAM cells for storing programming information. An example of an SRAM cell suitable for use with the AND/OR array 10 is described in detail in copending application Ser. No. 502,572, entitled SRAM based Cell for Programmable Logic Devices, which is hereinto incorporated by reference.

Row drivers 12 provide data inputs to the AND/OR array, and output signals are generated by output drivers 14. A shift register 16 is connected to the array 10, and is used for shifting programming data onto the device for writing into the array 10 when it is programmed. The shift register 16 has the same number of bits as there are product terms in the array 10. Thus, for example, if the array 10 has 132 product terms, the shift register 16 has 132 bits. A single shift register 16 is used to program all of the rows of the array 10, regardless of the number of rows in the device. The bits of the shift register 16 can be directly controlled by four control signals 18 as will be further described in connection with FIG. 2.

A one bit wide RAM 20 is connected to the shift register 16. The RAM 20 will also be referred to herein as a "shadow RAM". The shadow RAM 20 has one bit corresponding to each bit of the shift register 16. Test logic 22 is connected to the shadow RAM 20 and the shift register 16, and is used to generate a MATCH signal as will be described below.

The shift register 16 is used when programming the device in the manner typically known in the art. The shadow RAM 20 and test logic 22 can be used as described in copending application Ser. No. 545,921, entitled Power Reduction Circuit for Programmable Logic Device, to generate signals for automatically disabling input buffers as described in that application. The shadow RAM 20 and test logic 22 will be further described only as they are used with the testing function described herein.

In order to test the array 10 to insure that all programmable elements thereof function properly, the control signals 18 are used to write desired patterns directly into the shift register 16. These patterns are then programmed into the array 10, and are written into the RAM 20 under the control of a SAVE signal 24. The test data is then read back into the shift register 16 a row at a time, and compared with the data which was stored in the shadow RAM 20. Test logic 22 generates a MATCH signal when the data read from the array 10 is identical to that stored in the RAM 20. If one bit in the array 10 is nonfunctional, the row containing that bit will not generate the signal MATCH, and the device will be indicated to be defective.

Figure 2:
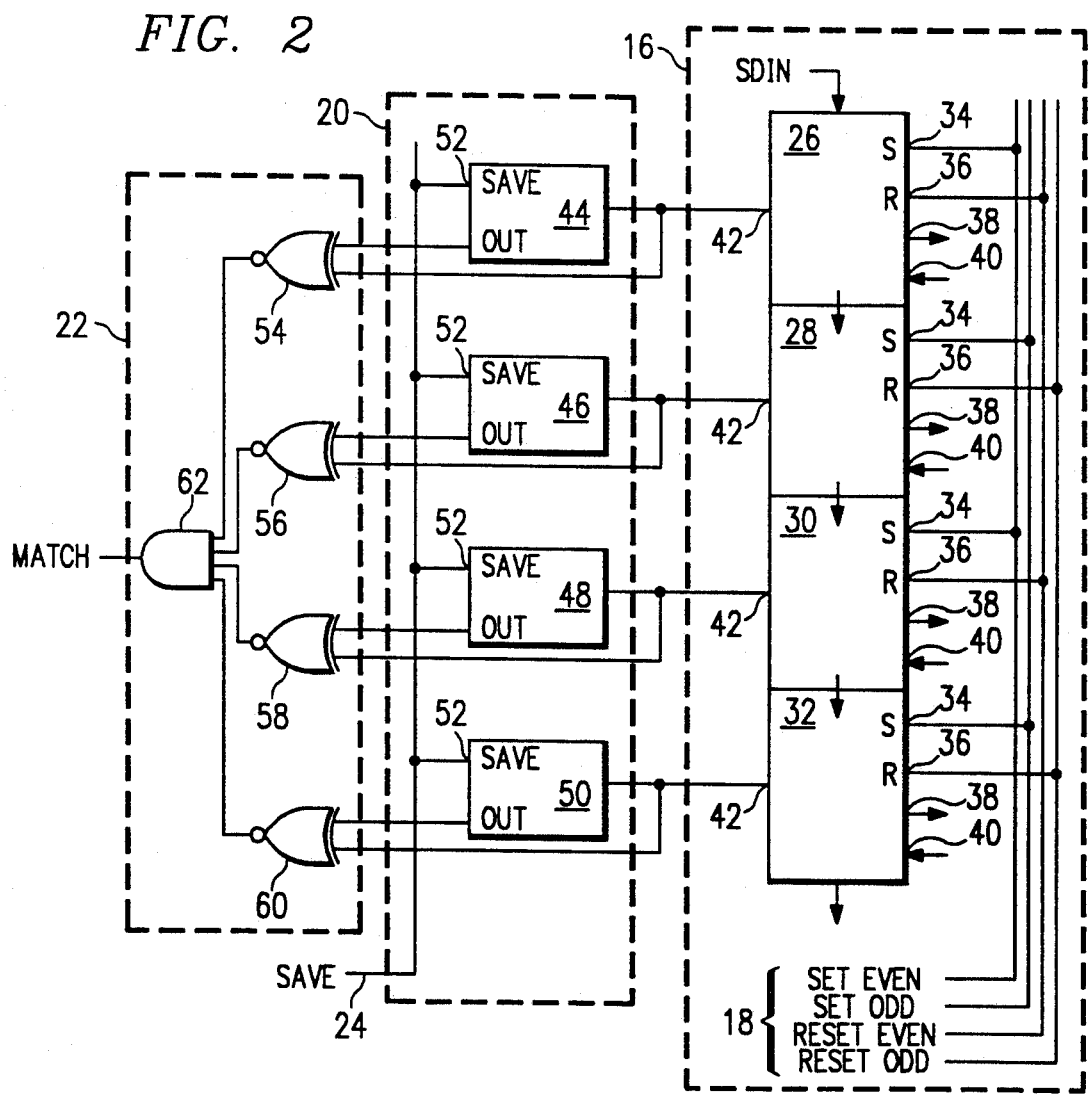
FIG. 2 is a schematic diagram of a portion of a shift register and associated circuitry according to the present invention.

FIG. 2 shows details of a portion of the shift register 16, shadow RAM 20, and test logic 22. Only four shift register cells 26, 28, 30 and 32 are shown, but the circuitry shown in FIG. 2 is extended to the entire device shown in FIG. 1. Each shift register cell 26-32 contains a set input 34 and a reset input 36. Each cell in the shift register 16 also contains an output 38 for writing data to the array, and an input 40 for reading data from the array. The inputs and outputs 38, 40 function in the same manner as those known in the art.

Each shift register cell 26 to 32 also has an output 42 for writing data to the shadow RAM 20. Shadow RAM 20 has a one bit cell 44, 46, 48 and 50 corresponding to each of the shift register cells 26, 28, 30 and 32. Save inputs 52 to each of the shadow RAM cells 44-50 are used to gate the cells to save the outputs from a corresponding shift register cells only when the signal SAVE is asserted.

Test logic 22 contains an exclusive-NOR gate 54, 56, 58 and 60 corresponding to each shadow RAM cell 44, 46, 48 and 50. The outputs of all of the exclusive-NOR gates 54-60 are connected to an AND gate 62 which generates the signal MATCH. Each exclusive-NOR gate 54-60 has one input connected to the output of the corresponding shadow RAM cell 44-50, and the other input connected to the output of the corresponding shift register cell 26-32. As known in the art, the particular logic gates used in the test logic circuitry 22 may be changed to different gates performing the same function.

Alternating columns, or product-terms, of the array 10 will be referred to as even or odd columns. In the portion of the shift register shown in FIG. 2, shift register cells 26 and 30 are connected to even numbered columns, while cells 28 and 32 are connected to odd numbered columns. The four control signals 18 which are provided are: SET EVEN, SET ODD, RESET EVEN, and RESET ODD. As shown, the SET EVEN signal, when asserted, sets all of the even numbered cells 26, 30 to a logical one. SET ODD does the same for the odd numbered cells 28, 32. When asserted, the signal RESET EVEN resets the even numbered cells 26, 30 to a logical zero, and RESET ODD performs the same function on the odd numbered cells 28, 32.

In order to test the function of the AND/OR array 10, the six basic test patterns described in the BACKGROUND can be written directly into the shift register 16 using the control signals 18. In order to write all logical ones into the array 10, both SET EVEN and SET ODD are asserted, setting all of the cells in the shift register 16 to one. To write all zeros into the array 10 RESET EVEN and RESET ODD are asserted to write logical zeros into all of the cells of shift register 16. The data written into the shift register 16 is then written into the array 10 as known in the art.

In order to write test stripes into the array 10, the shift register 16 is set to all ones or all zeros as just described, and written to every other row of the array 10. The other value is then written to the remaining rows. In order to write a checkerboard pattern into the array 10, SET EVEN and RESET ODD are asserted to write alternating ones and zeros into the shift register 16 for one-half of the rows. To generate the data for the remaining rows, the SET ODD and RESET EVEN signals are asserted at the same time.

Since the rows of the array 10 are typically manipulated during testing in order to write all even or all odd numbered rows simultaneously, only two write cycles are needed to completely program the array 10. Therefore, using the control signals 18, one test pattern can be written into the array 10 in the time required for two shift register 16 set/reset cycles, and two array 10 write cycles. This is performed in only a few hundreds of nanoseconds in SRAM based devices.

In the prior art, after a test pattern has been written to the array, it is necessary to read each programmed column back into the shift register and shift it out of the device in order to determine whether each bit was successfully programmed. In order to minimize total testing time, it is therefore necessary to provide on chip circuitry for determining whether all bits in each row have been successfully programmed. This function is performed by the shadow RAM 20 and test logic 22.

When the output of each shadow RAM cell 44-50 is identical to the output of its corresponding shift register cell 26-32, the output of each corresponding exclusive-NOR gate 54-60 is a logical one. When the output of all the exclusive-NOR gates 54-60 are a logical one, the output of AND gate 62 is also a logical one. Thus, when the bit pattern in the shadow RAM 20 is exactly the same as the bit pattern in the shift register 16, the signal MATCH is a logical one. If one or more bits differ, MATCH is a logical zero.

In order to verify programming of the device, after the array has been programmed the pattern for either the odd or even rows of the array is placed into the shift register 16 as described above. The signal SAVE is asserted in order to copy such bit pattern into the shadow RAM 20. Each of the rows of the array which are supposed to contain that pattern are then read into the shift register 16, one at a time. If the data for that row matches that which is supposed to be there, indicating a successful programming of that row, the signal MATCH will be a logical one. This process is repeated for each of the rows of the array, and if all rows generate a proper MATCH signal, then the test pattern was successfully programmed into the array.

For the all ones and all zeros test pattern, only a single pattern need be written to the shadow RAM 20. Then each row in the array can be compared to the shadow RAM sequentially. When one of the alternating test patterns, such as stripes or checkerboards, are written into the array, the shadow RAM 20 must be loaded with two different test values, one for the odd numbered array rows and one for the even numbered array rows. The shadow RAM 20 can be written once with the pattern for the even numbered rows in the array, and then compared sequentially with all of the even numbered array rows. It can then be written with the pattern for the odd rows and compared to each of them sequentially.

The output of the AND gate 62 can be connected to an off-chip pin for reading by a testing device, or can be used internally to determine whether all of the bits of the array pass all of the tests. In the latter case, a single bit can be output at the end of the test cycle, or at the end of testing of each test pattern, for verification by the tester. If desired, the shadow RAM 20 can be eliminated, and the contents of a pattern stored in the register can be compared directly with values read from the array 10 and connected to the test logic 22.

Since testing each row of the array 10 after a test pattern has been written thereto takes only a few nanoseconds, the entire device can be tested with all six basic patterns in a few microseconds. This is a tremendous time savings over prior art devices, which typically require hundreds of microseconds simply to shift the test data and verification data into and out of the device. Since SRAM cells may be written so quickly, the overall testing time for the programmable logic device is greatly decreased, increasing tester throughput and decreasing testing costs.

While the invention has been particularly shown and described with reference to a preferred embodiment, it will be understood by those skilled in the art that various changes in form and detail may be made therein without departing from the spirit and scope of the invention.

What is claimed is:

1. Test circuitry for a programmable logic device, comprising:

a memory array having a plurality of programmable elements arranged in rows and columns;

a shift register connected to said memory array for writing data onto the programmable logic device for programming said memory array to define logic functions and for holding data read from said memory array;

test logic connected to said memory array and to said shift register for comparing data stored therein, wherein an output signal indicative of a match is generated when the data stored in said memory array is exactly the same as the contents of said shift register;

means for directly setting the bits of said shift register to selected values without shifting data into said shift register to generate test patterns for writing into said memory array; and means for writing the contents of said shift register to said memory array.

2. The test circuitry of claim 1, wherein alternate bits of said shift register are designated as odd and even bits, and wherein all odd bits are set and reset simultaneously to generate the test patterns, and wherein all even bits are set and reset simultaneously to generate the test patterns.

3. Test circuitry for a programmable logic device, comprising:

a shift register for writing data onto the programmable logic device for programming said memory array to define logic functions and for holding data read from said memory array;

a memory array connected to said shift register, wherein contents of said shift register can be written to said memory array;

test logic connected to said memory array and to said shift register for comparing data stored therein, wherein an output signal indicative of a match is generated when the data stored in the memory array is exactly the same as the contents of said shift register;

control means for successively causing selected rows of the memory array to be read into said shift register, wherein test data stored in said memory array is compared with each of the selected rows to verify proper programming of the memory array; and control means for directly setting the bits of said shift register to selected values without shifting data into said shift register.

4. The test circuitry of claim 3, wherein said test logic comprises a plurality of exclusive-NOR gates each having inputs connected to one bit of said memory array and to one bit of said shift register, and means for generating an output signal which is a logical AND function of outputs of all of the exclusive-NOR gates.

5. The test circuitry of claim 3, wherein said memory array latches data stored in said shift register upon application of a save signal.

* * * * *